United States Patent
Millar et al.

(10) Patent No.: US 10,069,519 B1
(45) Date of Patent: Sep. 4, 2018

(54) PARTITION BASED DISTRIBUTION MATCHER FOR PROBABILISTIC CONSTELLATION SHAPING

(71) Applicant: Mitsubishi Electric Research Laboratories, Inc., Cambridge, MA (US)

(72) Inventors: David Millar, Concord, MA (US); Tobias Fehenberger, Munich (DE); Toshiaki Koike-Akino, Belmont, MA (US); Keisuke Kojima, Weston, MA (US); Kieran Parsons, Cambridge, MA (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 0 days.

(21) Appl. No.: 15/877,612

(22) Filed: Jan. 23, 2018

(51) Int. Cl.
| | |
|---|---|
| *H04L 27/00* | (2006.01) |
| *H03M 13/39* | (2006.01) |
| *H03M 13/11* | (2006.01) |
| *G06F 17/18* | (2006.01) |

(52) U.S. Cl.
CPC ... *H03M 13/3916* (2013.01); *H03M 13/1171* (2013.01); *H03M 13/3911* (2013.01); *H03M 13/3927* (2013.01); *H03M 13/3933* (2013.01); *G06F 17/18* (2013.01)

(58) Field of Classification Search
CPC ........... H04L 25/03343; H04L 25/4927; H04L 25/4975; H04L 1/0618; H04L 1/06; H04L 25/0204; H04L 25/0334; H04L 25/497; H04L 25/03057; H03M 13/25;
(Continued)

(56) References Cited

U.S. PATENT DOCUMENTS

| | | | | |
|---|---|---|---|---|
| 3,973,199 A | * | 8/1976 | Widmer | H03M 3/042 341/143 |
| 4,586,182 A | * | 4/1986 | Gallager | H04L 27/3438 375/241 |

(Continued)

*Primary Examiner* — James M Perez
(74) *Attorney, Agent, or Firm* — Gene Vinokur; James McAleenan; Hironori Tsukamoto

(57) ABSTRACT

A communication system includes a data source to receive a block of bits, a memory to store a set of distribution matchers. Each distribution matcher is associated with a probability mass function (PMF) to match equally likely input bits to a fixed number of output bits with values distributed according to the PMF of the distribution matcher. Each distribution matcher is associated with a selection probability, such that a sum of joint probabilities of all distribution matchers equals a target PMF. A joint probability of a distribution matcher is a product of PMF of the distribution matcher with the selection probability of the distribution matcher. The communication system also includes a shaping mapper to select the distribution matcher from the set of distribution matchers with the selection probability and to map the block of bits to a block of shaped bits with a non-uniform distribution using the selected distribution matcher and a transmitter front end to transmit the block of shaped bits over a communication channel, such that bits in a sequence of the blocks of shaped bits are distributed according to the target PMF.

15 Claims, 12 Drawing Sheets

(58) Field of Classification Search
CPC .... H04B 14/04; H04B 7/0417; H04B 7/0669; H04B 3/32; H04B 3/23
USPC ............... 375/242–254, 259–285, 295–296
See application file for complete search history.

(56) References Cited

U.S. PATENT DOCUMENTS

| | | | | |
|---|---|---|---|---|
| 5,062,152 A * | 10/1991 | Faulkner | | H03M 7/00 341/107 |
| 5,297,170 A * | 3/1994 | Eyuboglu | | H03M 7/3082 375/241 |
| 6,055,277 A * | 4/2000 | Stephens | | H03M 13/2742 370/535 |
| 6,128,346 A * | 10/2000 | Suarez | | H04N 19/63 341/143 |
| 6,223,162 B1 * | 4/2001 | Chen | | H03M 7/46 704/501 |
| 6,377,930 B1 * | 4/2002 | Chen | | H03M 7/42 341/63 |
| 6,504,877 B1 * | 1/2003 | Lee | | G06T 9/008 341/200 |
| 6,510,173 B1 * | 1/2003 | Garmonov | | H04L 1/0071 375/141 |
| 6,661,856 B1 * | 12/2003 | Calderbank | | H04B 7/0669 375/267 |
| 7,023,935 B2 * | 4/2006 | Cao | | H04L 25/0204 375/262 |
| 7,526,047 B2 * | 4/2009 | Lee | | H04L 1/0618 375/265 |
| 7,593,449 B2 * | 9/2009 | Shattil | | H04B 1/707 375/130 |
| 7,864,883 B2 * | 1/2011 | Park | | H04L 27/34 332/103 |
| 7,965,761 B2 * | 6/2011 | Shattil | | H04B 1/7174 375/147 |
| 8,005,158 B2 * | 8/2011 | Leonidov | | H04L 27/2608 375/134 |
| 8,050,356 B2 * | 11/2011 | Nam | | H04B 7/0689 375/267 |
| 8,135,082 B2 * | 3/2012 | Choi | | H04L 1/0041 375/264 |
| 8,381,065 B2 * | 2/2013 | Djordjevic | | H03M 13/033 375/262 |
| 8,405,531 B2 * | 3/2013 | Tuzel | | G06K 9/00429 341/50 |
| 8,457,240 B2 * | 6/2013 | Lee | | H04B 7/0417 375/285 |
| 8,498,544 B2 * | 7/2013 | Duan | | G06F 7/5057 398/208 |
| 8,526,520 B2 * | 9/2013 | Turunen | | H04L 27/0006 375/224 |
| 8,675,751 B2 * | 3/2014 | Cannon | | H04L 27/183 375/144 |
| 8,699,607 B2 * | 4/2014 | Seller | | H04L 27/2649 375/256 |
| 8,798,174 B2 * | 8/2014 | Rave | | H04L 1/005 375/243 |
| 8,995,568 B1 * | 3/2015 | Wu | | H04L 25/49 375/260 |
| 9,559,786 B2 * | 1/2017 | Millar | | H04B 10/6972 |
| 9,680,684 B2 * | 6/2017 | Stadelmeier | | H04L 27/3405 |
| 9,716,536 B2 * | 7/2017 | Koike-Akino | | H04B 7/0456 |
| 9,806,743 B2 * | 10/2017 | Koike-Akino | | H03M 13/1111 |
| 2003/0003863 A1 * | 1/2003 | Thielecke | | H04B 7/0417 455/39 |
| 2003/0031233 A1 * | 2/2003 | Kim | | H04L 1/0066 375/146 |
| 2003/0067993 A1 * | 4/2003 | Viswanathan | | H04L 1/0618 375/267 |
| 2003/0081690 A1 * | 5/2003 | Kim | | H04L 1/0003 375/264 |
| 2003/0194014 A1 * | 10/2003 | Modlin | | H04L 1/0003 375/242 |
| 2003/0220122 A1 * | 11/2003 | Lim | | H04B 7/0845 455/522 |
| 2004/0062318 A1 * | 4/2004 | Yu | | H04L 1/0003 375/264 |
| 2004/0067064 A1 * | 4/2004 | McNicol | | H04B 10/25137 398/158 |
| 2004/0208255 A1 * | 10/2004 | Yoshida | | H04B 7/068 375/260 |
| 2005/0002461 A1 * | 1/2005 | Giannakis | | H04L 25/0228 375/259 |
| 2005/0068909 A1 * | 3/2005 | Chae | | H04L 1/0003 370/278 |
| 2005/0276317 A1 * | 12/2005 | Jeong | | H04B 7/0689 375/213 |
| 2006/0215784 A1 * | 9/2006 | Nam | | H04B 7/0689 375/299 |
| 2007/0002969 A1 * | 1/2007 | Jeong | | H04L 1/0041 375/298 |
| 2007/0260772 A1 * | 11/2007 | Garmonov | | H03M 13/1131 710/33 |
| 2009/0046806 A1 * | 2/2009 | Yu | | H04B 7/0669 375/296 |
| 2010/0239046 A1 * | 9/2010 | Chun | | H04L 1/0003 375/295 |
| 2011/0129234 A1 * | 6/2011 | Duan | | G06F 7/5057 398/208 |
| 2011/0165846 A1 * | 7/2011 | Zheng | | H04B 7/0417 455/67.13 |
| 2014/0214348 A1 * | 7/2014 | Sahinoglu | | G01R 31/3651 702/63 |
| 2015/0236817 A1 * | 8/2015 | Orlik | | H04L 1/0052 375/341 |
| 2015/0350001 A1 * | 12/2015 | Zhu | | H04L 27/38 375/262 |
| 2016/0182138 A1 * | 6/2016 | Xi | | H04B 7/0456 375/267 |
| 2016/0277083 A1 * | 9/2016 | Koike-Akino | | H04B 7/0456 |
| 2016/0277121 A1 * | 9/2016 | Millar | | H04B 10/6972 |
| 2016/0315704 A1 * | 10/2016 | Djordjevic | | H04L 1/0041 |
| 2017/0141796 A1 * | 5/2017 | Koike-Akino | | H03M 13/1111 |
| 2017/0170914 A1 * | 6/2017 | Saha | | H04B 15/00 |
| 2017/0171855 A1 * | 6/2017 | Sundararajan | | H04W 72/0413 |
| 2018/0091225 A1 * | 3/2018 | Wang | | H04B 10/5161 |

\* cited by examiner

PARTITION BASED DISTRIBUTION MATCHER FOR PROBABILISTIC CONSTELLATION SHAPING

TECHNICAL FIELD

This invention relates generally to digital communications systems, and more particularly to encoding and decoding data transmitted over a noisy channel.

BACKGROUND

Since the birth of digital communications, it has been known that the optimal signal distribution for an additive white Gaussian noise channel is not uniform. There are two primary approaches to generate the non-uniform distribution for digital communications systems—geometric shaping, whereby equiprobable constellation points are arranged in a non-uniform manner in order to maximize performance; and probabilistic shaping, whereby the probabilities of constellation points are optimized in order to maximize performance. While it is generally accepted that the performance of probabilistic shaping is superior to the performance of geometric shaping for equal cardinality, methods for mapping sequences of uniformly distributed bits of information (such as those which we would like to transmit) onto sequences of non-equiprobable symbols has proven extremely challenging. The most commonly used method is that of constant composition distribution matching (CCDM), which maps equiprobable bits onto a sequence which is a permutation of the "typical sequence," which has the desired symbol probability mass function (PMF). While this method can achieve good performance (achieving arbitrarily low rate loss for asymptotically long symbol sequences), it has two critical flaws: the ability to achieve low rate-loss requires very long sequences, which causes high complexity and latency; and the only known efficient mapping and de-mapping algorithms are sequential in symbols (that is, need to decode each symbol in-turn in a symbol sequence), which also leads to prohibitively high complexity and latency.

SUMMARY

It is an object of some embodiments to transform an input sequence of symbols with equiprobable, i.e., uniform, distribution of values of bits into an output sequence of symbols with values of bits with desired non-uniform distribution. Some embodiments are based on the realization that a set of symbols can be partitioned into a number of unique subsets, each of which has a number of possible unique permutations. According to this realization, the desired total distribution of the symbol set can be achieved by using a number of smaller sets which do not individually have the desired distribution, but have an average distribution which is equal to the desired distribution. In some embodiments, the distribution is defined by the probability mass function (PMF) reflecting the discrete nature of digital signal processing. To that end, the desired distribution is referred herein as the target PMF.

Specifically, some embodiments are based on realization that the input sequence of symbols can be transformed on block-by-block bases. For example, some embodiments transform a block of bits with uniform distribution of values of bits into a block of shaped bits with a non-uniform distribution of values of bits. However, some embodiments are based on realization that PMF of the non-uniform distribution of the block of shaped bits can differ from the target PMF as long as different blocks of shaped bits with different PMFs form a sequence of bits with the target PMF. Such a realization allows reducing the length of the block of bits to transform with respect to the length of the block of bits transformed only according to the target PMF. This enables a reduction in rate-loss, which corresponds to an increase in the maximum rate at which data can be transmitted over a channel.

Some embodiments are based on realization that the formation of the target PMF of the transmitted sequence of bits depends on PMF of each individual block of shaped bits and on frequency of occurrence of the blocks of shaped bits with different PMFs in the transmitted sequence of bits. For example, if the target PMF equals $0.6 PMF_1 + 0.3 PMF_2 + 0.1 PMF_3$ then transmitted sequence of bits should have twice as many of the blocks of shaped bits transformed to have distribution of bits according to $PMF_1$ than blocks of shaped bits transformed to have distribution of bits according to $PMF_2$ and should have three times as many of the blocks of shaped bits transformed to have distribution of bits according to $PMF_2$ than blocks of shaped bits transformed to have distribution of bits according to $PMF_3$. This realization allows different embodiments to combine distribution matching with different PMFs with the probability of selection of different distribution matching to achieve the design flexibility of transmission with target PMF.

Some embodiments are based on recognition that for transmission of the binary symbols, the symbols are typically selected from a finite alphabet. Some embodiments are based on recognition that the PMF of the block of shaped bits can be defined by a frequency of occurrence of each symbol in the block of shaped bits. However, the order of symbols in the block of shaped bits is irrelevant for PMF, hence, the permutation of the block of shapes bits having a particular PMF can encode different input block of bits having the same particular PMF. Such an understanding simplifies mapping of the block of bits to the block of shaped bits with a particular PMF.

Some embodiments are based on the realization that the total number of blocks of shaped bits desired should be a power of two when transmitting binary information, and that the selection of certain subsets and permutations thereof to achieve a power of two number of overall sequences may be advantageous in constructing mapping and demapping algorithms.

Some embodiments are based on the realization that the total number of permutations in each collection of subsets may be rounded down to the nearest power of two achievable by all subsets in a partition, thus allowing the assignment of an integer number of bits to each of subset. This structure allows for a fixed word length which comprises a variable length header (used to assign the subset which has PMF used in the distribution matcher), and a variable number of bits to determine the desired permutation assigned by the distribution matcher.

Some embodiments are based on the further realization that by splitting the desired multiset into subsets, which each have a certain number of permutations, the mapping and demapping algorithms may be described as: (i) determining the number of each possible symbol in the symbol sequence according to the prefix bits; (ii) determining the permutation of the symbol sequence according to the remaining bits in the input block of bits.

Accordingly, one embodiment discloses a communication system including a data source to receive a block of bits; a memory to store a set of distribution matchers, each distribution matcher is associated with a probability mass function (PMF) to match equally likely input bits to a fixed number of output bits with values distributed according to the PMF of the distribution matcher, wherein each distribution matcher is associated with a selection probability, such that a sum of joint probabilities of all distribution matchers equals a target PMF, wherein a joint probability of a distribution matcher is a product of PMF of the distribution matcher with the selection probability of the distribution matcher; a shaping mapper to select the distribution matcher from the set of distribution matchers with the selection probability and to map the block of bits to a block of shaped bits with a non-uniform distribution using the selected distribution matcher; and a transmitter front end to transmit the block of shaped bits over a communication channel, such that bits in a sequence of the blocks of shaped bits are distributed according to the target PMF.

Another embodiment discloses a method for communicating symbols of bits, wherein the method uses a processor coupled with stored instructions implementing the method, wherein the instructions, when executed by the processor carry out at least some steps of the method. The method includes receiving a block of bits; selecting a distribution matcher from a memory storing a set of distribution matchers, wherein each distribution matcher is associated with a probability mass function (PMF) to match equally likely input bits to a fixed number of output bits with values distributed according to the PMF of the distribution matcher, wherein each distribution matcher is associated with a selection probability, such that a sum of joint probabilities of all distribution matchers equals a target PMF, wherein a joint probability of a distribution matcher is a product of PMF of the distribution matcher with the selection probability of the distribution matcher; mapping the block of bits to a block of shaped bits with a non-uniform distribution using the selected distribution matcher; and transmitting the block of shaped bits over a communication channel, such that bits in a sequence of the blocks of shaped bits are distributed according to the target PMF.

DETAILED DESCRIPTION

Figure 1A:
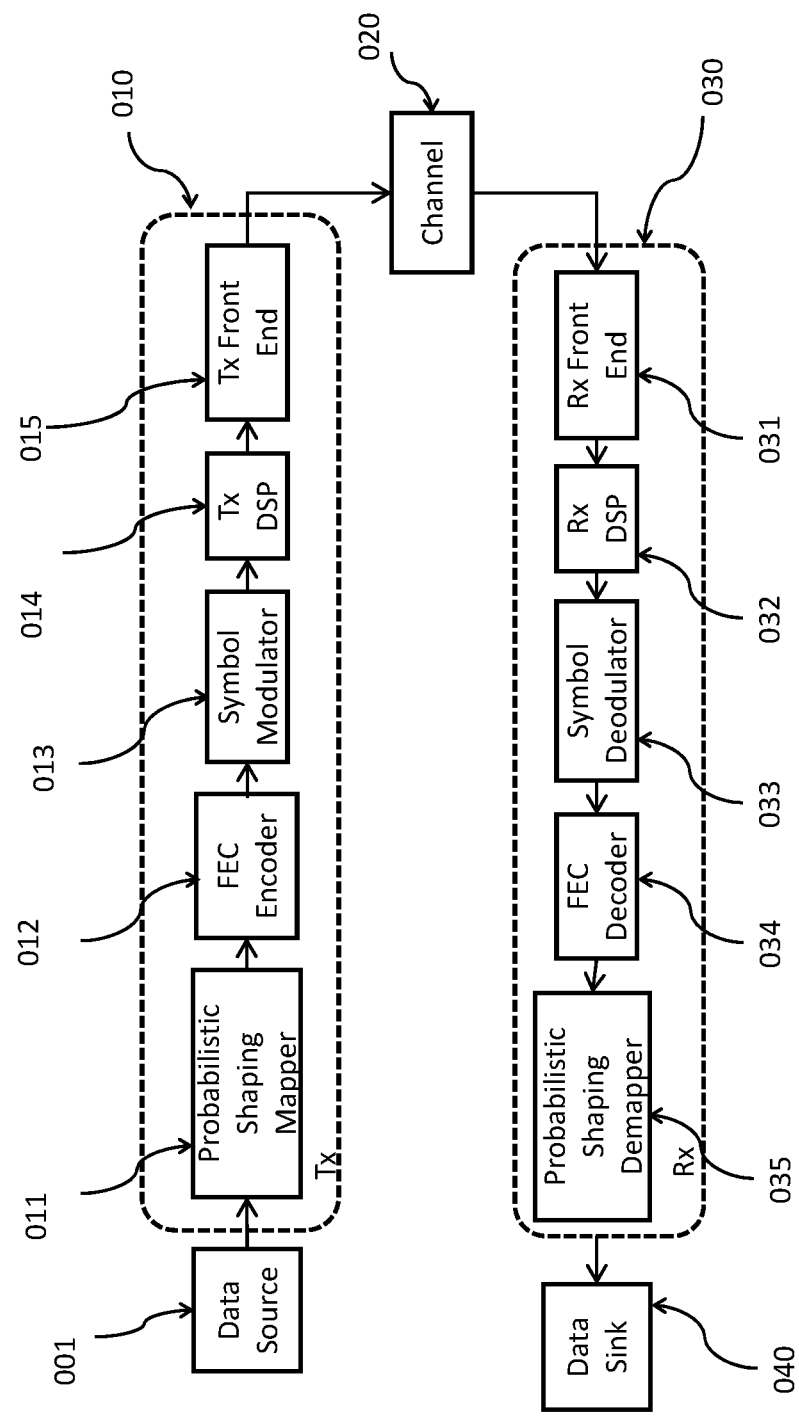
FIG. 1A is a block diagram of a digital communication system employing probabilistic amplitude shaping according to some embodiments of the invention.

FIG. 1A shows a block diagram of a probabilistically shaped digital communication system according to some embodiments. Data from a source (001) is sent to a transmitter (Tx) (010). For example, the data is first sent to a probabilistic shaping mapper (011) and then the data is sent to a forward error correction (FEC) encoder block (012), to produce a set of bits where some are shaped, and others (in particular, parity bits from the FEC encoder) are uniformly distributed. After encoding, the bits are mapped to quadrature amplitude modulation (QAM) symbols (013), before the signal undergoes digital signal processing (DSP) (014). In some embodiments, DSP also performs other function such as mapping, filtering and pre-equalization. The signal is then sent to the transmitter front end (015), where analog operations such as amplification, filtering, modulation and up-conversion occur, and then transmitted over a channel (020) to a receiver (Rx) (030).

At the receiver, the signal first passes through the receiver front end (031) for performing analog operations such as down-conversion, amplification, filtering and quantization of the received signal to produce a digital signal. The digital signal is processed by digital processor (032) for functions such as front-end correction, chromatic dispersion compensation, equalization and carrier phase estimation. The noisy QAM symbols then undergo demapping (033) to, for example, bit log-likelihood ratios (LLRs). The FEC code is then decoded (034), before the decoded bits are sent to the probabilistic shaping demapper (035). The demapped and uniformly distributed bits are then sent on to their destination, e.g., the data sink (040).

Figure 1B:
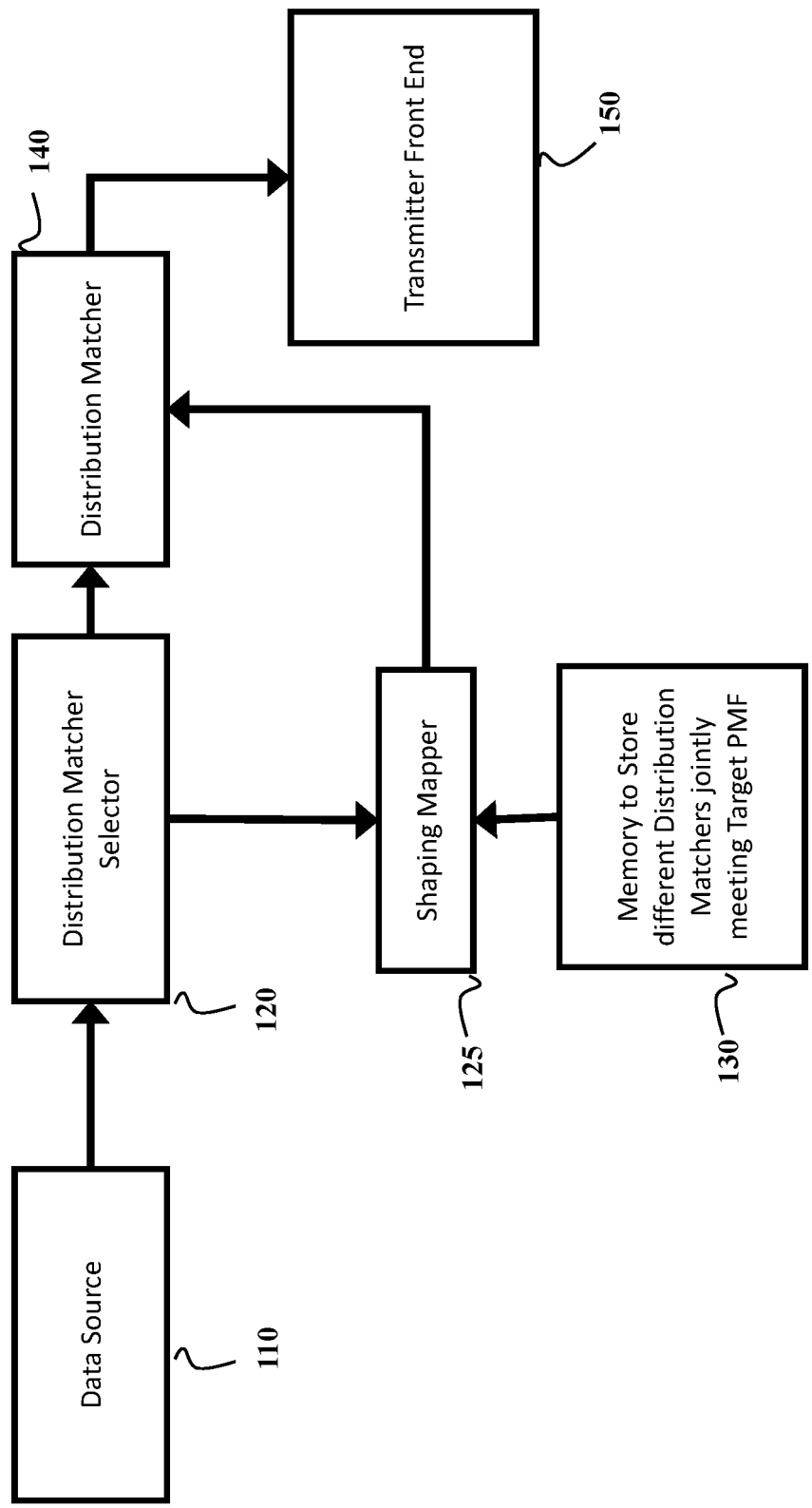
FIG. 1B is a probabilistic shaping mapper according to some embodiments of the invention.

FIG. 1B shows a block diagram of a communication system according to some embodiments. A data source (110) receives a block of bits, at least some of which are sent to a distribution matcher selector (120). A memory (130) to store a set of distribution matchers, each distribution matcher being associated with a probability mass function (PMF) to match equally likely input bits to a fixed number of output bits with values distributed according to the PMF of the distribution matcher. A shaping mapper (125) is used to select the distribution matcher (140) from the set of distribution matchers with the selection probability and to map the block of bits to a block of shaped bits with a non-uniform distribution using the selected distribution matcher. A transmitter front end (150) is then used to transmit the block of shaped bits over a communication channel, such that bits in a sequence of the blocks of shaped bits are distributed according to the target PMF.

In such a manner, some embodiments transform an input sequence of symbols with equiprobable, i.e., uniform, distribution of values of bits into an output sequence of symbols with values of bits with desired non-uniform distribution. Some embodiments partition a set of symbols into a number of unique subsets, each of which has a number of possible unique permutations. In such a manner, the desired total distribution of the symbol set is achieved by using a number of smaller sets which do not individually have the desired distribution, but have an average distribution which is equal to the desired distribution. In some embodiments, the distribution is defined by the probability mass function (PMF) reflecting the discrete nature of digital signal processing. To that end, the desired distribution is referred herein as the target PMF. According to some embodiments, the target PMF is a Maxwell-Boltzmann distribution.

Specifically, some embodiments are based on realization that the input sequence of symbols can be transformed on block-by-block bases. For example, some embodiments transform a block of bits with uniform distribution of values of bits into a block of shaped bits with a non-uniform distribution of values of bits. However, some embodiments are based on realization that PMF of the non-uniform distribution of the block of shaped bits can differ from the target PMF as long as different blocks of shaped bits with different PMFs form a sequence of bits with the target PMF. Such a realization allows reducing the length of the block of bits to transform with respect to the length of the block of bits transformed only according to the target PMF. As all sequences with the target PMF are included within such a scheme, it is observed that as additional sequences can be introduced, that a partition based design will be able to represent a number of sequences equal to or greater than a constant composition system, and therefore have equal or lower rate-loss, which may correspond to a higher achievable data-rate to be transmitted over the channel.

Some embodiments are based on realization that the formation of the target PMF of the transmitted sequence of bits depends on PMF of each individual distribution matcher and on frequency of using the distribution matcher to transform the block of bits. For example, if the target PMF equals $0.6PMF_1+0.3PMF_2+0.1PMF_3$ then transmitted sequence of bits should have twice as many of the blocks of shaped bits transformed to have distribution of bits according to $PMF_1$ than blocks of shaped bits transformed to have distribution of bits according to $PMF_2$ and should have three times as many of the blocks of shaped bits transformed to have distribution of bits according to $PMF_2$ than blocks of shaped bits transformed to have distribution of bits according to $PMF_3$. To that end, the distribution matcher for the $PMF_1$ should be used twice as many times as a distribution matcher for $PMF_2$ and six as many times than the distribution matcher for $PMF_3$. This realization allows different embodiments to combine distribution matching with different PMFs with the probability of selection of different distribution matching to achieve the design flexibility of transmission with target PMF.

To that end, in some embodiments, each distribution matcher 140 is associated with a selection probability, such that a sum of joint probabilities of all distribution matchers equals a target PMF. In various embodiments, a joint probability of a distribution matcher is a product of PMF of the distribution matcher with the selection probability of the distribution matcher. For example, in the above-mentioned example, the joint probability of a first distribution matcher is $0.6PMF_1$, the joint probability of the second distribution matcher is $0.3PMF_2$ and the joint probability of the third distribution matcher is $0.1PMF_3$.

According to one embodiment, the shaping mapper (125) selects the distribution matcher (140) according to values of at least some bits in the block of bits. In this embodiment, a probability of an occurrence of the values in the block of bits equals the selection probability of the distribution matcher. This embodiment is based on recognition that different length of the uniformly distributed input bits can be used to achieve the desired selection probability.

For example, the selection probability 50% can be achieved by analyzing a value of a single bit. For example, a distribution matcher with a selection probability of 50% can be selected when a value of an input bit is "0." On the other hand, the selection probability of 25% can be achieved by analyzing values of 2 bits. For example, a distribution matcher with a selection probability of 25% can be selected when a value of an input bit is "10." By analyzing different sequences of different length of the input bits, different distribution matchers can be selected.

In various embodiments, the memory 130 can store distribution matcher with the same and/or different PMF and with the same and/or different selection probability. For example, in one embodiment, the memory (130) stores a first distribution matcher associated with a first PMF and a first selection probability, and a second distribution matcher associated with a second PMF different from the first PMF and a second selection probability, wherein the first selection probability equals the second selection probability, and the sum of the joint probabilities of the first and the second distribution matchers equals the target PMF. In another embodiment, the memory (130) stores a first distribution matcher associated with a first PMF and a first selection probability, a second distribution matcher associated with a second PMF different from the first PMF and a second selection probability, and a third distribution matcher associated with a third PMF different from the second PMF and a third selection probability, wherein the third PMF equals the target PMF, and wherein the first selection probability equals the second selection probability, and the sum of the joint probabilities of the first, the second, and the third distribution matchers equals the target PMF.

Figure 1C:
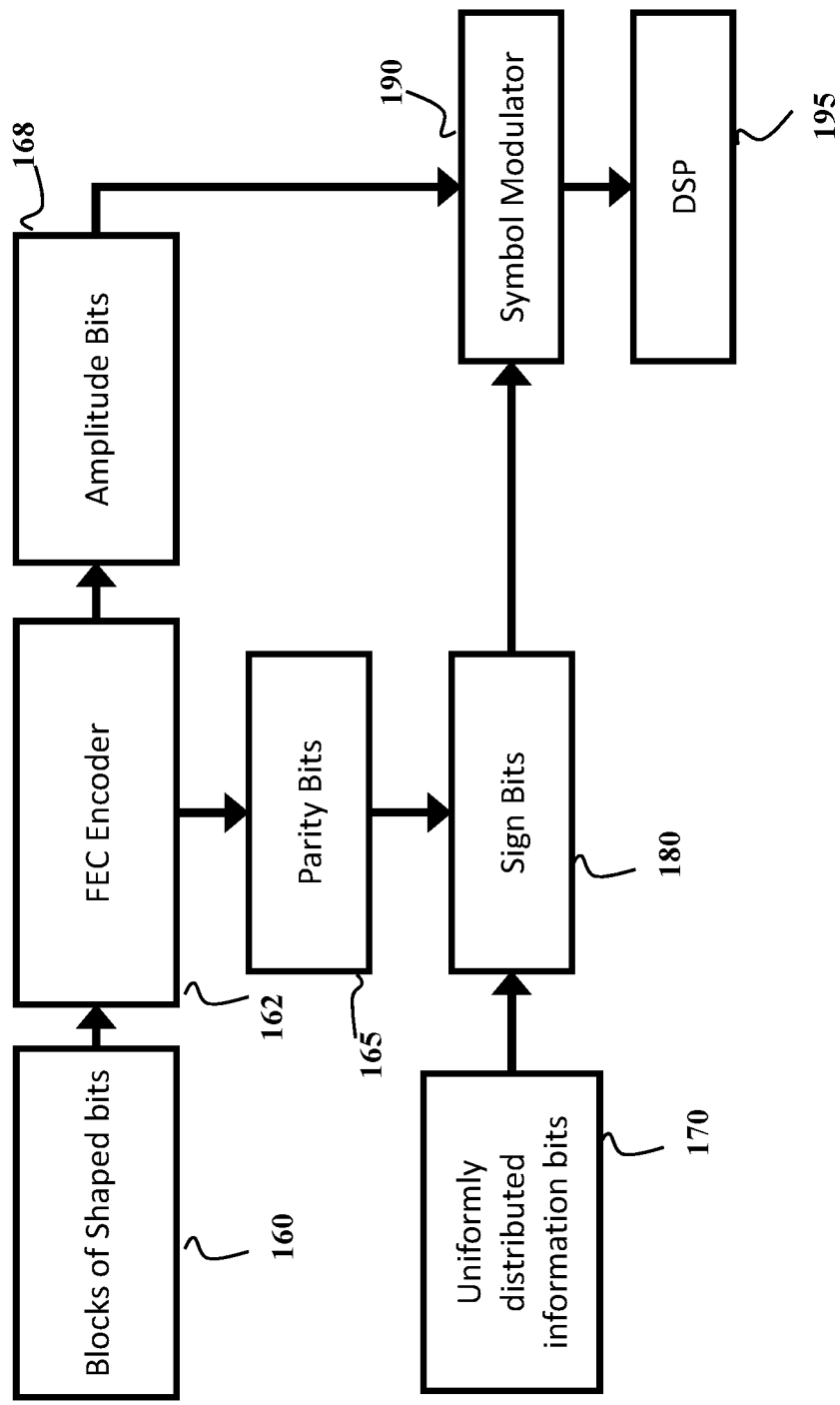
FIG. 1C is an encoder and symbol modulator according to some embodiments of the invention.

FIG. 1C shows a block diagram of the encoder and modulator according to some embodiments. An FEC encoder (162) is used to generate uniformly distributed parity bits (165) from blocks of shaped bits (160) with non-uniform distribution, and combine the parity bits in a modulator (190) with the bits of the blocks of shaped bits (160). According to some embodiments, at least some of the parity bits (165) are sign bits (190). Some of the sign bits (180) may optionally be composed of uniformly distributed information bits (170).

For example, according to some embodiments, the modulator (190) modulates the sequence of the blocks of shaped bits (160) onto amplitude bits (168) of QAM symbols, with at least some of the sign bits being determined by the uniformly distributed parity bits (165). A digital signal processor (DSP) (195) is then used for processing the modulated sequence of the blocks of shaped bits for analog transmission over the communication channel.

Figure 2A:
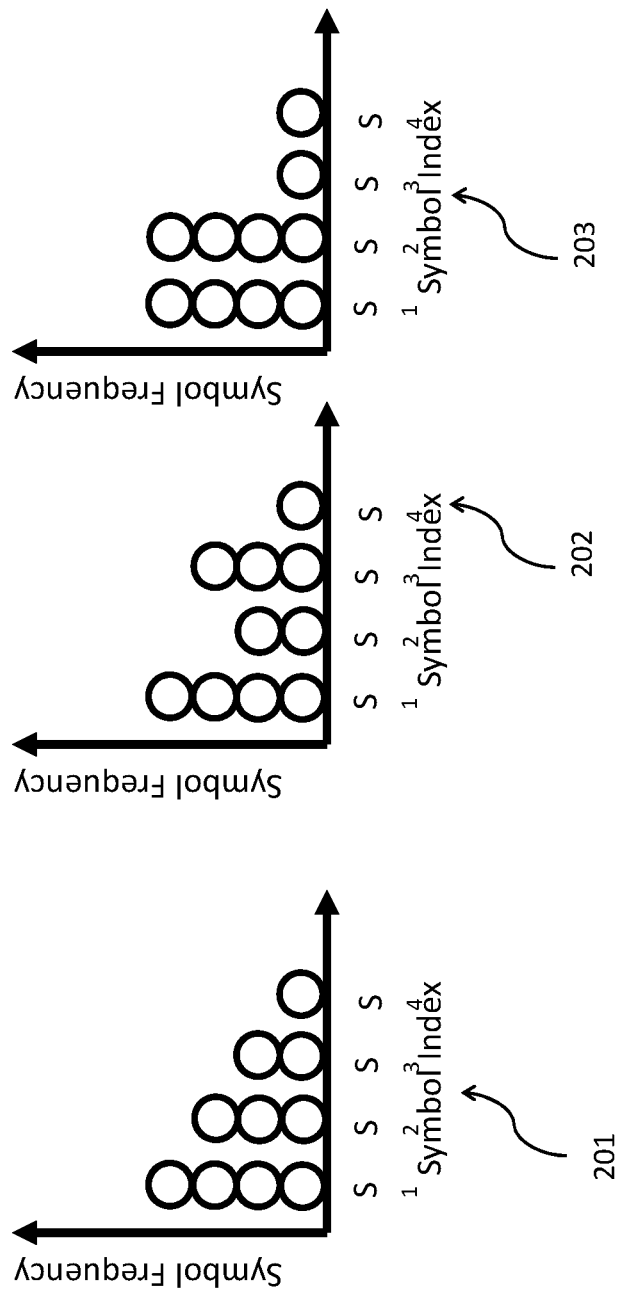
FIG. 2A is an exemplar structure of the signal histogram, including a comparison of a constant composition distribution matcher, and a partition based distribution matcher according to some embodiments of the invention.

FIG. 2A shows a schematic demonstrating the concept of non-constant composition distributions used by some embodiments. In a constant composition distribution matcher (CCDM), every block of shaped bits prepared for the transmission has the same number of occurrences of each possible symbol. In contrast, in the non-constant composition distributions used by some embodiments, different block of shaped bits have different distribution of occurrences of symbols.

For example, in the exemplar schematic of FIG. 2A, the symbols are selected from a finite alphabet including four symbols {S1, S2, S3, S4}. Each block of shaped bits include ten symbols, however, the distribution of symbols in different block varies. For example, in distribution 201, the distribution of occurrences of four possible symbols {S1, S2, S3, S4} is, {4,3,2,1}. The total number of distinct sequences which have this composition is therefore given by the multinomial coefficient 10!/(4!3!2!1!)=12600. This determines the entropy of the distribution matcher which is given by log 2(12600)/10=1.36 bits/symbol. The entropy of the PMF X is given by sum(−X*log 2(X)) which is 1.85 bits/symbol in this example. Rate loss is therefore 1.85−1.36=0.49 bits in this example.

Some of the embodiments of this invention are based on the realization that a non-constant composition distribution matcher may be described as the sum of several distributions which have, on average, the desired distribution. For example, the distributions (202) and (203) have number of occurrences of four possible symbols {S1, S2, S3, S4} as {4,2,3,1} and {4,4,1,1} respectively. Some of the embodiments are based on the realization that by combining one occurrence of the distribution described in (202) and one described in (203), the average behavior is that described in (201).

Furthermore, the number of distinct sequences with the distribution shown in (202) is given by the multinomial coefficient 10!/(4!2!3!1!)=12600, and the complementary distribution (203) is given by the multinomial coefficient 10!/(4!4!1!1!)=6300. A pair-wise partition based distribution matcher only be 6300 sequences for each composition described by the distributions of (202) and (203) respectively while maintaining the overall distribution described in (201). By considering the distributions in (201), (202), and (203), some embodiments use 12600 sequences from (201); 6300 sequences from (202); and 6300 from (203)—25200 in total. This increases the entropy of the distribution matcher by 0.1 bit/symbol, and reduces the rate loss from 0.49 bits to 0.39 bits.

Figure 2B:
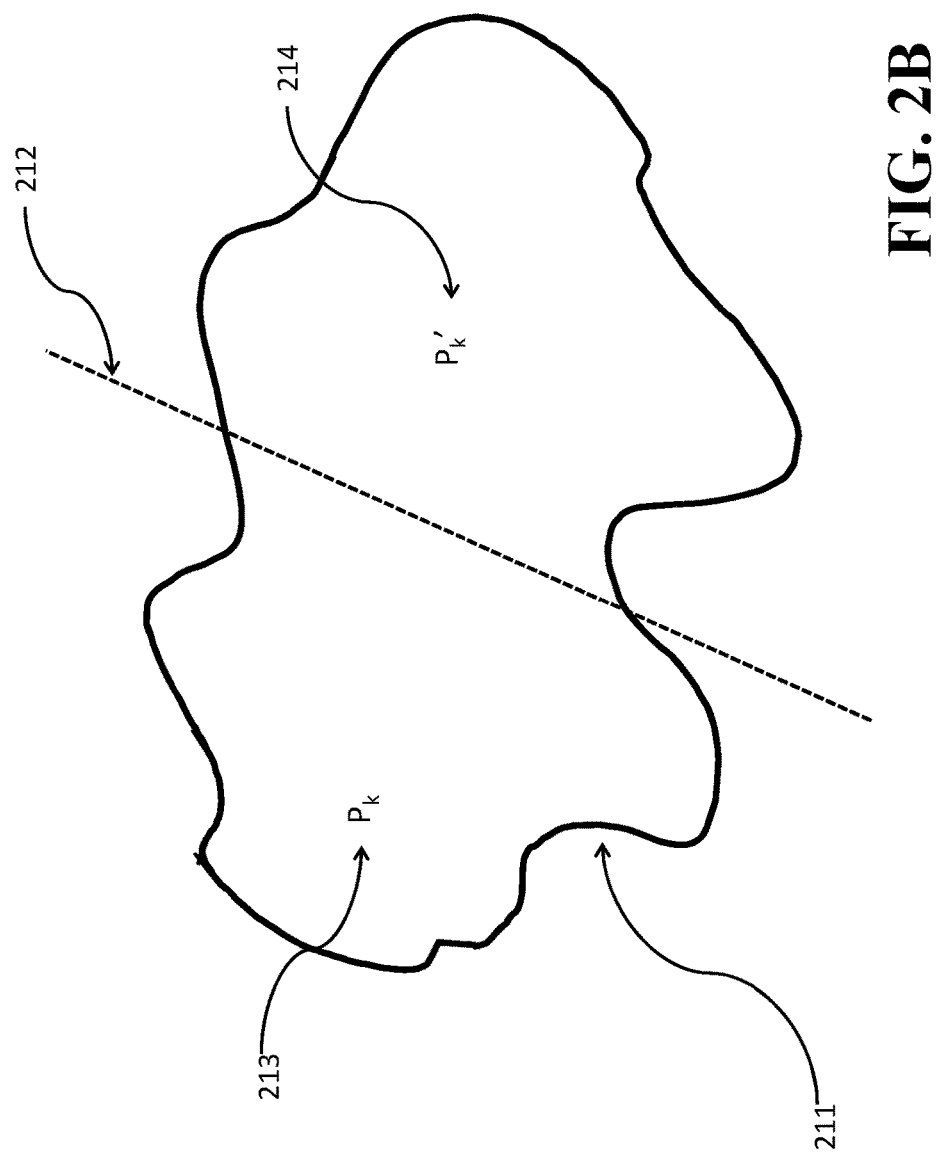
FIG. 2B is a schematic showing the binary partitioning of a target distribution multiset according to some embodiments of the invention.

FIG. 2B shows a schematic of the method of partitioning (212) a large multiset (211) into two smaller subsets (213) and (214) which have each an equal number of elements. While pair-wise partitioning is shown here for the sake of simplicity, the larger multiset could be partitioned into arbitrarily many smaller subsets, which do not need to be unique. Notably, the possible number of distinct sequences for the smaller subsets (213) and (214) are in general not equal. Thus, some embodiments select a number of sequences drawn from each subset that allows the overall composition of the distribution matcher to be that of the desired distribution.

Figure 2C:
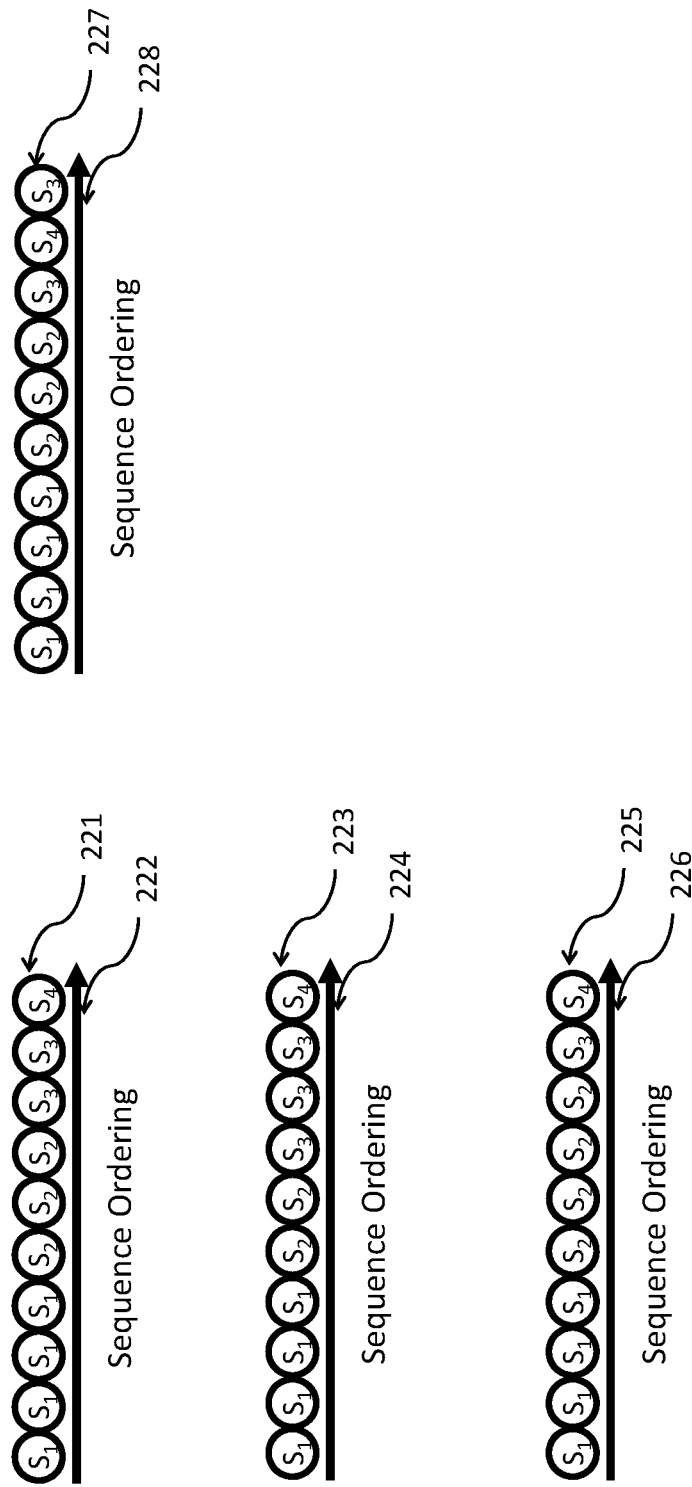
FIG. 2C is a set of exemplar symbol sequences with differing PMF and permutation.

FIG. 2C shows a schematic of sequences with differing composition and permutation according to some embodiments. Some embodiments are based on recognition that for transmission of the binary symbols, the symbols are typically selected from a finite alphabet. Some embodiments are based on recognition that the PMF of the block of shaped bits can be defined by a frequency of occurrence of each symbol in the block of shaped bits. However, the order of symbols in the block of shaped bits is irrelevant for PMF, hence, the permutation of the block of shapes bits having a particular PMF can encode different input block of bits having the same particular PMF. Such an understanding simplifies mapping of the block of bits to the block of shaped bits with a particular PMF.

For example, a set of symbols (221) is shown in an ordering (222), having composition which is described in the histogram of (201). We see a different (228) of the same set of symbols (227) which is also drawn from the subset with composition given by (201). Notably, the sequence orderings (222) and (228) are distinct and unique. A second set of symbols (223) is also given an ordering (224), which has composition described by the histogram in (202). A third set of symbols (225) is also given an ordering (226), which has composition described by the histogram in (203). Notably, the sequences (224) and (226) have an average composition given by the histogram (201).

Figure 3:
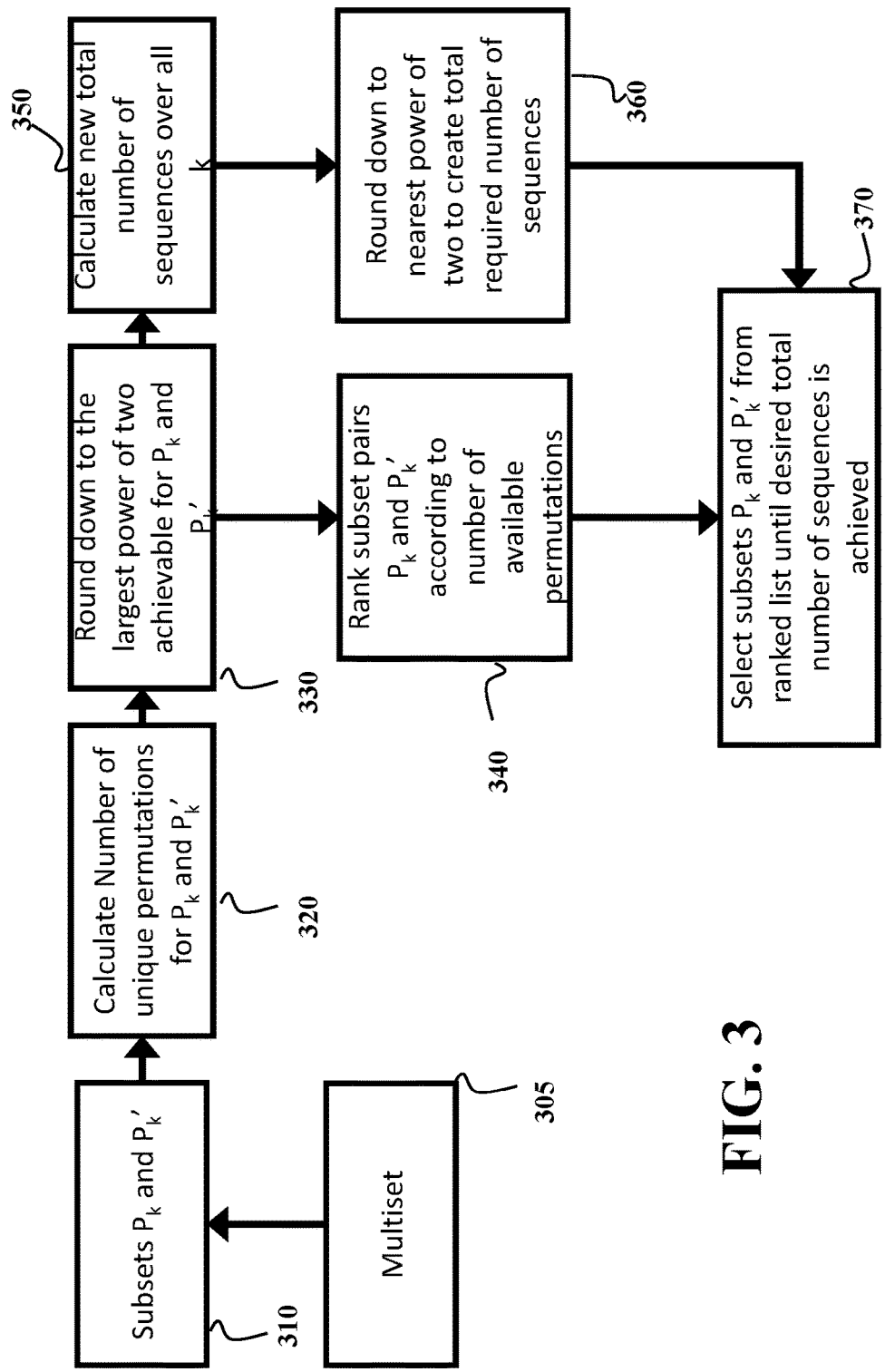
FIG. 3 is a set of diagrams illustrating the rounding procedure used for binary subsets in order to ensure that an integer number of bits per subset is used according to some embodiments of the invention.

FIG. 3 shows a schematic of the method used by some embodiments to produce a fixed length block for the distribution matcher. A multiset (305) includes symbols with frequency of occurrence defined by the target PMF and with a total number of symbols equal to a multiple of a number of symbols in the block of the shaped bits. For example, if multiple is two, the multiset (305) can include a double of symbols shown in histogram 201.

The multiset (305) is then partitioned to generate a number of subsets (310) of symbols with a total number of symbols in each subset equal to the number of symbols in the block of the shaped bits, wherein the number of subsets generated by the partition is equal to the multiple of the number of symbols for the multiset (305) of symbols. For example, when the multiple is two, the double of symbols shown in histogram 201 can be partitioned into the multisets 202 and 203. When the multiple is three, the three times of symbols shown in histogram 201 can be partitioned into three multisets, etc.

The number of permutations for each subset is then calculated (320), end the maximum number of permutations of symbols for each generated subset determined by the highest pair of two (330) that is less than or equal to multinomial coefficients determined by the number of occurrences of each symbol in the subset, calculated in (320). The size of the block of bits as a maximal power of two (330) in the subset with the smallest number of permutations.

According to some other embodiments, a multiset of symbols (305) is generated with frequency of occurrence defined by the target PMF and with a total number of symbols equal to a multiple of a number of symbols in the block of the shaped bits. Multiple partitions of the multiset of symbols are performed to generate, for each partition, a number of subsets (310) of symbols with a total number of symbols in each subset equal to the number of symbols in the block of the shaped bits, wherein the number of subsets generated by the partition is equal to the multiple of the number of symbols for the multiset of symbols. For each partition, a maximum number of permutations of symbols for each generated subset (330) determined by the highest pair of two that is less than or equal to multinomial coefficients determined by the number of occurrences of each symbol in the subset (320). For each partition, a maximal power of two (330) is generated in the subset with the smallest number of permutations, before forming the sum (350) of the maximal powers of two over all subsets of all partitions and determining the size of the block of bits as a maximal power of two according to the sum of the maximal powers (360). Subsets are then selected (370) from a list formed by ranking the partitions according to their maximal power of two, until the total number of sequences over all selected subsets are equal to the total required number of sequences (360).

Some of these embodiments are based on the realization that by rounding the component partitions to a power of two number of sequences, a whole number of bits may be represented by each partition. This enables the use of the pre-existing constant composition distribution matching algorithm to determine which sequence is used within the partition. Some embodiments of this invention are based on the further realization that by rounding the total number of sequences to a power of two, an integer number of bits can be represented by the total distribution matcher, therefore enabling a fixed block-length, with a variable length header to determine which partition is used.

Figure 4A:
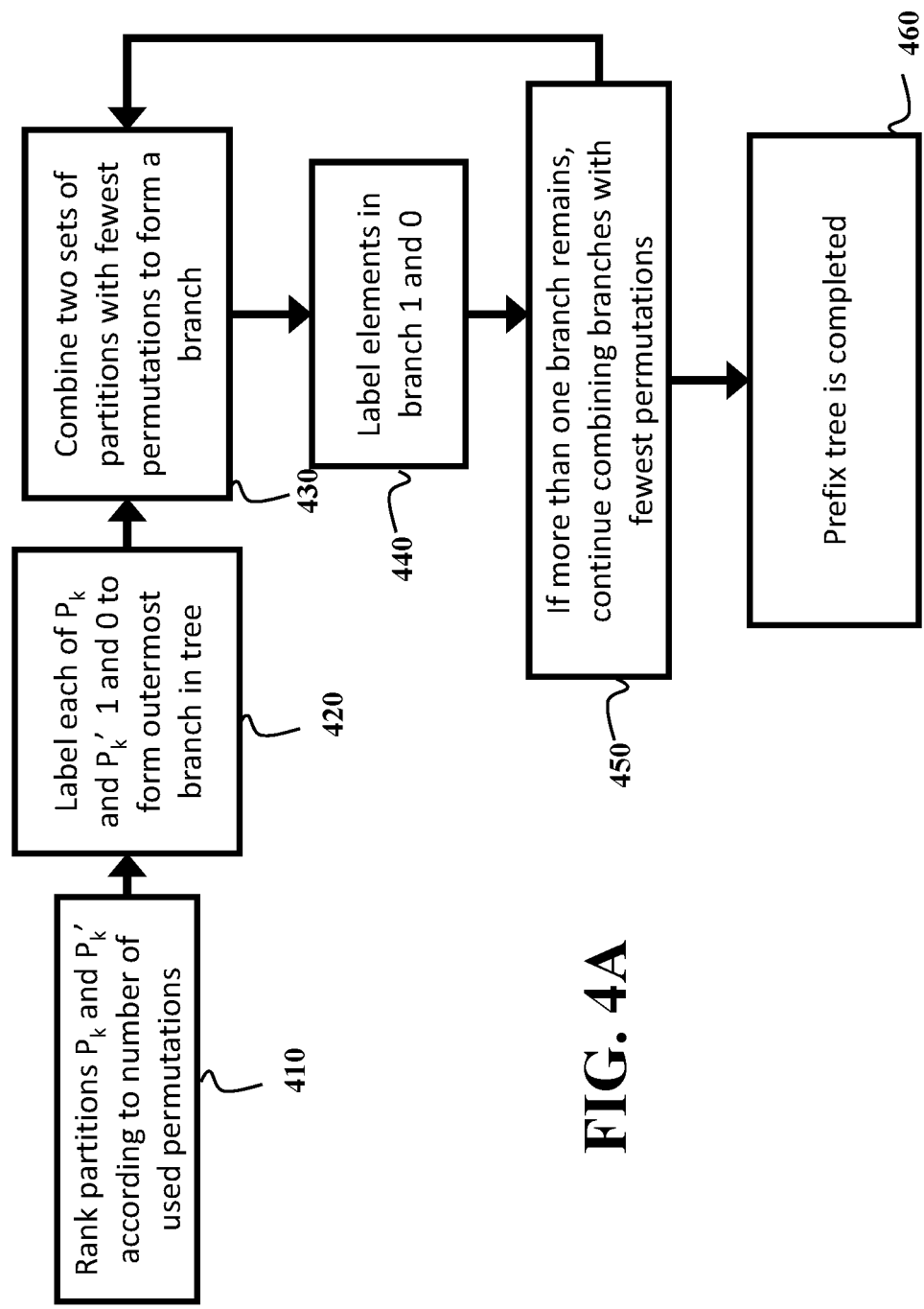
FIG. 4A is a block diagram of the tree-based subset bit-labelling procedure which enables a variable length header according to one embodiment of the invention.

FIG. 4A shows a method for generating a tree structured variable length header to provide bit-labels for the different partitions according to some embodiments. The different partitions are ranked according to the number of times that they are used in the matcher (410), then the pairs $P_k$ and $P_k'$ are labeled 1 and 0 to form the outermost branch in the tree (420). The two sets of partitions with the fewest total number of uses are then merged to form a branch (430), with one element labeled 1 and the other 0 (450). If more than one branch remains, the merging and labeling process is repeated (450). When only a single branch remains, the prefix tree is completed (460).

Figure 4B:
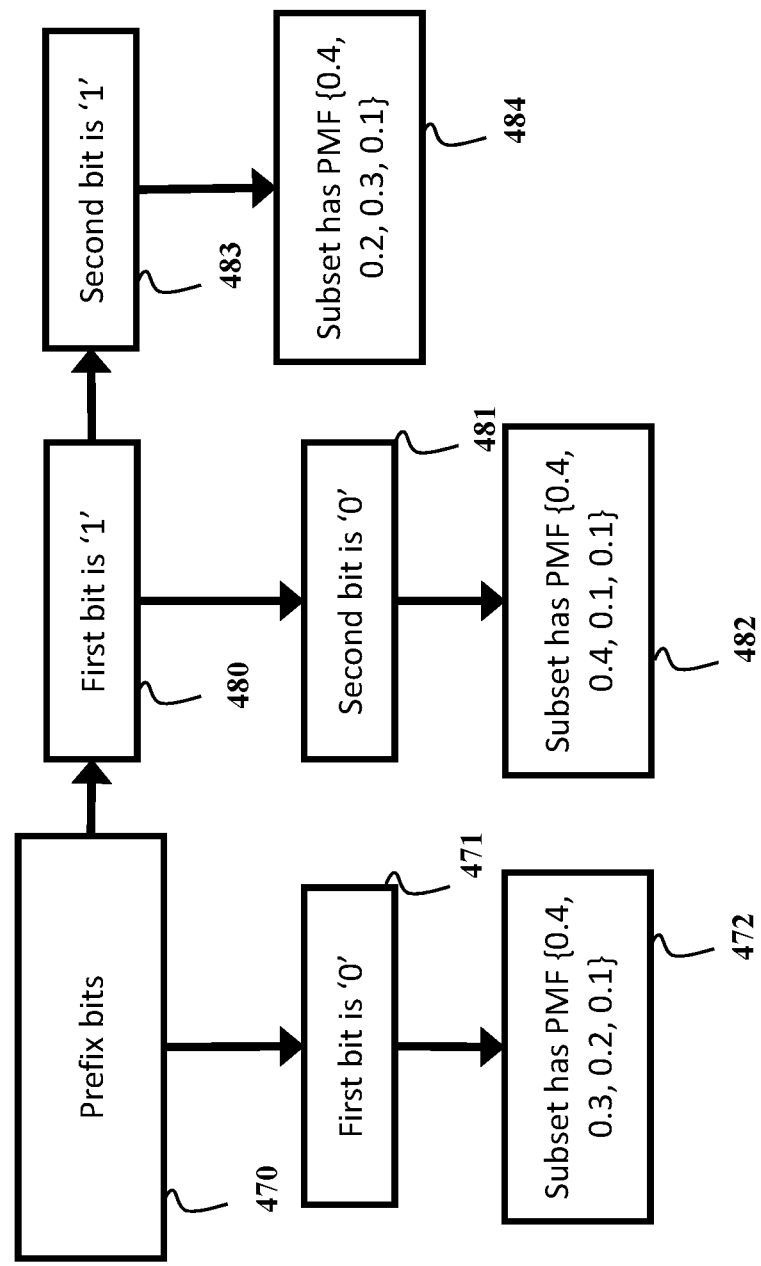
FIG. 4B is a block diagram of the procedure used for determining the PMF of the subset used in the distribution matcher according to some embodiments of the invention.

FIG. 4B shows a tree structure for selecting a distribution matcher according to a variable length prefix, according to one embodiment of the invention. A binary tree is selected from memory with leafs (472), (482), (484) defining the distribution matchers. The distribution matcher is selected from the binary tree using prefix bits (470) of the block of bits equal to a length of a path to the leaf of the distribution matcher through the binary tree. The path being determined by binary decisions at nodes (471), (480), (481), (483) according to the values of the prefix bits (470).

Some of these embodiments are based on the realization that for a variable length prefix, standard source coding techniques such as those described herein can be used to determine an optimal labeling for the prefix.

Figure 5:
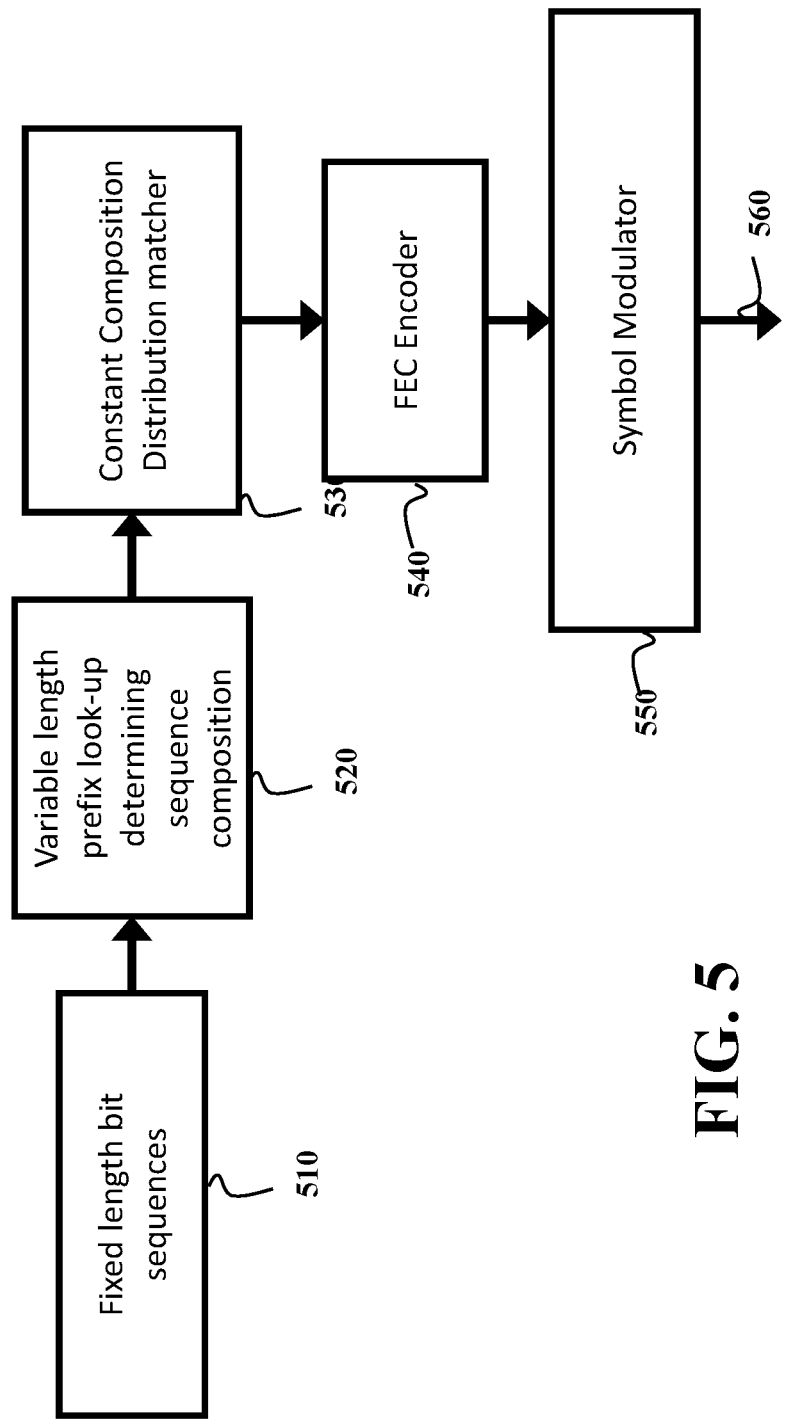
FIG. 5 is a block diagram of the distribution matching, encoding and modulation process at the transmitter according to some embodiments of the invention.

FIG. 5 describes a system for encoding a fixed length bit sequence onto a fixed length symbol sequence including forward error correction and probabilistic amplitude shaping according to some embodiments of this invention. A fixed length bit sequence (510) is used at least in part, as the input to a variable length prefix look-up table (520) to determine the composition of the sequence to be encoded. The composition of the sequence and at least some of the remaining bits are then sent to a constant composition distribution matcher (530) which outputs a sequence of shaped bits. These bits are then used as the input to a forward error correction encoder (540). The output of the FEC encoder (540) is then sent to the symbol modulator (550) where the shaped information bits are used to determine the amplitude levels of the QAM symbols, while the uniformly distributed parity bits and optionally some of the uniformly distributed information bits (510) are used to determine the sign bits of the QAM symbols. The symbol sequence is then sent on (560) for further processing before transmission over a channel.

Figure 6:
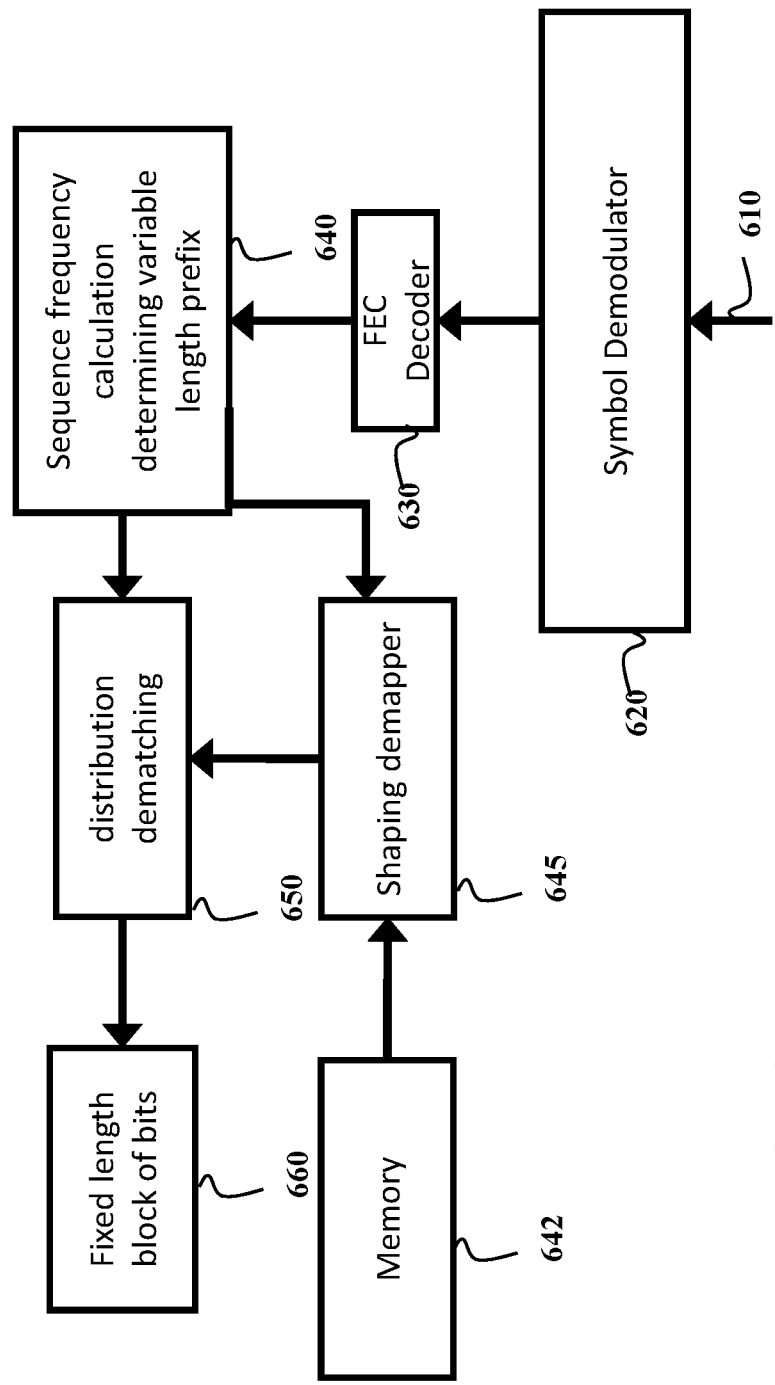
FIG. 6 is a block diagram of the demodulation, decoding and dematching process at the receiver according to some embodiments of the invention.

FIG. 6 shows a system for decoding and demodulating a fixed length sequence of symbols with probabilistic amplitude shaping and forward error correction onto a fixed length bit sequence according to some embodiments of this invention.

A symbol sequence (610) is sent from the receiver front end, to receive the block of shaped bits transmitted over a communication channel A receiver memory (642) to store a set of distribution dematchers, each distribution dematcher (650) is associated with the distribution matcher. A shaping demapper (645) is used to select the distribution dematcher (650) based on a frequency of occurrence (640) of symbols in the transmitted block of shaped bits and to map the transmitted block of shaped bits to the block of bits. The distribution dematching (650) then produces a fixed length block of bits (660).

Figure 7:
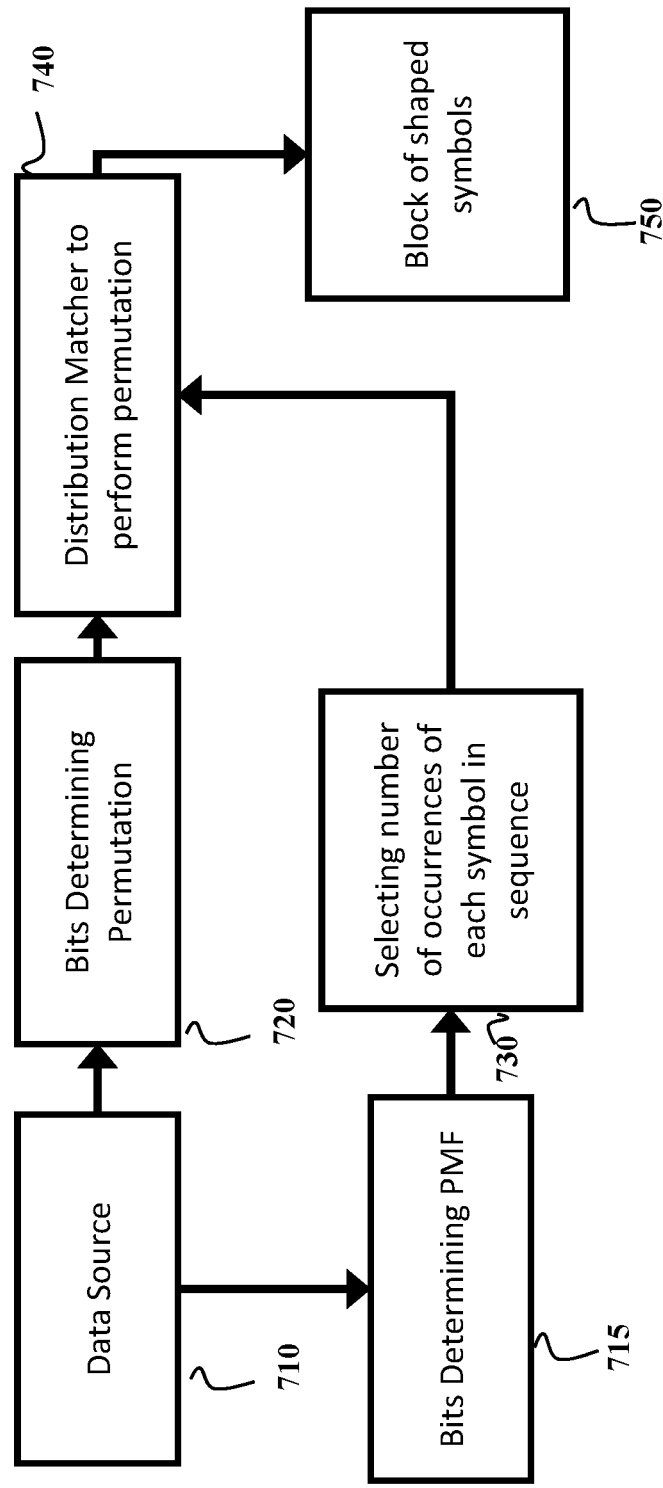
FIG. 7 is a block diagram of the shaping mapper and distribution matcher according to some embodiments of the invention.

FIG. 7 shows a shaping mapper and distribution matcher according to some embodiments of this invention. The symbols of the block of shaped bits (750) are produced by the distribution matcher (740) are selected from a finite set of symbols, and wherein the frequency of occurrence of different symbols in the block of shaped bits is defined by the PMF of the distribution matcher (730).

According to another embodiment, the selected distribution matcher permutes a sequence of symbols occurring in the sequence with frequencies defining the PMF of the distribution matcher (730) for different values of the bits (715) in the block of bits (710).

The above-described embodiments of the present invention can be implemented in any of numerous ways. For example, the embodiments may be implemented using hardware, software or a combination thereof. When implemented in software, the software code can be executed on any suitable processor or collection of processors, whether provided in a single computer or distributed among multiple computers. Such processors may be implemented as integrated circuits, with one or more processors in an integrated circuit component. Though, a processor may be implemented using circuitry in any suitable format.

Also, the embodiments of the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Use of ordinal terms such as "first," "second," in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Although the invention has been described by way of examples of preferred embodiments, it is to be understood that various other adaptations and modifications can be made within the spirit and scope of the invention.

Therefore, it is the object of the appended claims to cover all such variations and modifications as come within the true spirit and scope of the invention.

We claim:

1. A communication system, comprising:
   a data source to receive a block of bits;
   a memory to store a set of distribution matchers, each distribution matcher is associated with a probability mass function (PMF) to match equally likely input bits to a fixed number of output bits with values distributed according to the PMF of the distribution matcher, wherein each distribution matcher is associated with a selection probability, such that a sum of joint probabilities of all distribution matchers equals a target PMF, wherein a joint probability of a distribution matcher is a product of PMF of the distribution matcher with the selection probability of the distribution matcher;
   a shaping mapper to select the distribution matcher from the set of distribution matchers with the selection probability and to map the block of bits to a block of shaped bits with a non-uniform distribution using the selected distribution matcher; and
   a transmitter front end to transmit the block of shaped bits over a communication channel, such that bits in a sequence of the blocks of shaped bits are distributed according to the target PMF.

2. The communication system of claim 1, wherein the target PMF is a Maxwell-Boltzmann distribution.

3. The communication system of claim 1, wherein the shaping mapper selects the distribution matcher according to values of at least some bits in the block of bits, wherein a probability of an occurrence of the values in the block of bits equals the selection probability of the distribution matcher.

4. The communication system of claim 1, wherein the memory stores a first distribution matcher associated with a first PMF and a first selection probability, and a second distribution matcher associated with a second PMF and a second selection probability, wherein the first PMF differs from the second PMF, wherein the first selection probability equals the second selection probability, and wherein the sum of the joint probabilities of the first and the second distribution matchers equals the target PMF.

5. The communication system of claim 1, wherein the memory stores a first distribution matcher associated with a first PMF and a first selection probability, a second distribution matcher associated with a second PMF and a second selection probability, and a third distribution matcher associated with a third PMF and a third selection probability, wherein the first PMF differs from the second, PMF, wherein the third PMF equals the target PMF, and wherein the first selection probability equals the second selection probability, and the sum of the joint probabilities of the first, the second, and the third distribution matchers equals the target PMF.

6. The communication system of claim 1, further comprising:
an FEC encoder to generate uniformly distributed parity bits from blocks of shaped bits with the non-uniform distribution of bits and to combine the parity bits with the bits of the blocks of shaped bits.

7. The communication system of claim 6, wherein at least some of the parity bits are sign bits.

8. The communication system of claim 6, further comprising:
a modulator to modulate the sequence of the blocks of shaped bits onto amplitude bits of QAM symbols, with at least some of the sign bits being determined by the uniformly distributed parity bits; and
a digital signal processor for processing the modulated sequence of the blocks of shaped bits for analog transmission over the communication channel.

9. The communication system of claim 1, wherein symbols of the block of shaped bits produced by the distribution matcher are selected from a finite set of symbols, and wherein the frequency of occurrence of different symbols in the block of shaped bits is defined by the PMF of the distribution matcher.

10. The communication system of claim 9, wherein the selected distribution matcher permutes a sequence of symbols occurring in the sequence with frequencies defining the PMF of the distribution matcher for different values of the bits in the block of bits.

11. The communication system of claim 9, further comprising:
a processor to
produce a multiset of symbols with frequency of occurrence defined by the target PMF and with a total number of symbols equal to a multiple of a number of symbols in the block of the shaped bits;
partition the multiset of symbols to generate a number of subsets of symbols with a total number of symbols in each subset equal to the number of symbols in the block of the shaped bits, wherein the number of subsets generated by the partition is equal to the multiple of the number of symbols for the multiset of symbols;
select a maximum number of permutations of symbols for each generated subset determined by the highest pair of two that is less than or equal to multinomial coefficients determined by the number of occurrences of each symbol in the subset; and
determine the size of the block of bits as a maximal power of two in the subset with the smallest number of permutations.

12. The communication system of claim 9, further comprising:
a processor to
produce a multiset of symbols with frequency of occurrence defined by the target PMF and with a total number of symbols equal to a multiple of a number of symbols in the block of the shaped bits;
performing multiple partitions of the multiset of symbols to generate, for each partition, a number of subsets of symbols with a total number of symbols in each subset equal to the number of symbols in the block of the shaped bits, wherein the number of subsets generated by the partition is equal to the multiple of the number of symbols for the multiset of symbols;
select, for each partition, a maximum number of permutations of symbols for each generated subset determined by the highest pair of two that is less than or equal to multinomial coefficients determined by the number of occurrences of each symbol in the subset;
determine, for each partition, a maximal power of two in the subset with the smallest number of permutations;
sum the maximal powers of two over all subsets of all partitions; and
determine the size of the block of bits as a maximal power of two according to the sum of the maximal powers; and
selecting subsets from a list formed by ranking the partitions according to their maximal power of two, until the total number of sequences over all selected subsets are equal to the total required number of sequences.

13. The communication system of claim 1, further comprising:
a processor to
select from the memory a binary tree with leafs defining the distribution matchers; and
select the distribution matcher from the binary tree using a prefix bits of the block of bits equal to a length of a path to the leaf of the distribution matcher through the binary tree.

14. The communication system of claim 1, further comprising:
a receiver front end to receive the block of shaped bits transmitted over a communication channel;
a receiver memory to store a set of distribution dematchers, each distribution dematcher is associated with the distribution matcher,
a shaping demapper to select the distribution dematcher based on a frequency of occurrence of symbols in the transmitted block of shaped bits and to map the transmitted block of shaped bits to the block of bits.

15. A method for communicating symbols of bits, wherein the method uses a processor coupled with stored instructions implementing the method, wherein the instructions, when executed by the processor carry out at least some steps of the method, comprising:
- receiving a block of bits;
- selecting a distribution matcher from a memory storing a set of distribution matchers, wherein each distribution matcher is associated with a probability mass function (PMF) to match equally likely input bits to a fixed number of output bits with values distributed according to the PMF of the distribution matcher, wherein each distribution matcher is associated with a selection probability, such that a sum of joint probabilities of all distribution matchers equals a target PMF, wherein a joint probability of a distribution matcher is a product of PMF of the distribution matcher with the selection probability of the distribution matcher;
- mapping the block of bits to a block of shaped bits with a non-uniform distribution using the selected distribution matcher; and
- transmitting the block of shaped bits over a communication channel, such that bits in a sequence of the blocks of shaped bits are distributed according to the target PMF.

* * * * *